United States Patent [19]

Franco et al.

[11] 3,873,361

[45] Mar. 25, 1975

[54] METHOD OF DEPOSITING THIN FILM UTILIZING A LIFT-OFF MASK

[75] Inventors: Jack R. Franco, Poughkeepsie; Janos Havas, Hopewell Junction; Harold A. Levine, Poughkeepsie, all of N.Y.

[73] Assignee: International Business Machines Corporation, Armonk, N.Y.

[22] Filed: Nov. 29, 1973

[21] Appl. No.: 420,034

[52] U.S. Cl. .................................. 117/212, 204/192

[51] Int. Cl. .......................... B44d 1/18, H05k 1/00

[58] Field of Search...................... 117/212; 204/192

[56] References Cited

UNITED STATES PATENTS 3,700,497 10/1972 Epifano et al. .................... 117/212

*Primary Examiner*—John D. Welsh
*Attorney, Agent, or Firm*—Julius B. Kraft

[57] ABSTRACT

A method for use in depositing thin films in the fabrication of integrated circuits which avoids edge tearing of the films. The method involves depositing a non-photosensitive organic polymeric material on a substrate, and forming on said polymeric layer a masking layer of an inorganic material, preferably metal, having openings in a selected pattern. Then, forming, by reactive sputter etching, utilizing the metallic mask as a barrier, openings through the polymeric layer extending to the substrate, the openings in the polymeric layer being aligned with and laterally wider than the corresponding openings in the metallic masking layer. The thin film to be deposited is then applied over the structure; it is, thereby, deposited on the substrate in said openings. Then, the remaining polymeric layer is removed, lifting off the masking layer and the thin film above the polymeric layer to leave thin film deposited in a selected pattern in the openings.

16 Claims, 8 Drawing Figures

METHOD OF DEPOSITING THIN FILM UTILIZING A LIFT-OFF MASK

BACKGROUND OF INVENTION

This invention relates to a method of depositing thin films, particularly thin films such as metallic films, in the fabrication of integrated circuits.

Present trends in the formation of vacuum deposited thin metallic film make the use of etching in the presence of etch-resistant photoresist layers to provide the selected pattern. This, in effect, involves the traditional photoengraving or photolithographic etching techniques. However, with the continued miniaturization of semiconductor integrated circuits to achieve greater component density and smaller units in large scale integrated circuitry, the art is rapidly approaching a point where such photolithographic etching of deposited film may be impractical for providing the minute resolution required for the fine linework of metallization in such large scale integrated circuitry.

An alternative method for forming such metallization in large scale integrated circuitry, which is presently under consideration and use in the art, is commonly denoted by the term "expendable mask method," "lift-off method," or "stencil method." The following references are typical of those describing these known types of methods.

1. T. D. Schlaback et al., *Printed and Integrated Circuitry*, pp. 352–353, McGraw-Hill, New York, 1963.
2. K. C. Hu, "Expendable Mask: A New Technique for Patterning Evaporated Metal Films," *Electron Packaging and Production*, October 1967.
3. M. Hatzakis, "Electron Resist for Micro-Circuit and Mask Production", *Journal of The Electrochemical Society*, Vol. 116, p. 1033, 1969.
4. H. I. Smith et al., "A High-Yield Photolithographic Technique for Surface Wave Devices", *Journal of The Electrochemical Society*, Volume 118, p. 821, 1971.

Copending application, Ser. No. 384,349, entitled "Masking of Deposited Thin Films by Use of a Masking Layer-Photoresist Composite," filed July 31, 1973, assigned to the assignee of the present application, is directed to a lift-off method and structure for depositing thin films which avoid the "edge-tearing" problem. The method involves the formation of a metallic masking layer over an initial layer of photosensitive material on the substrate. The photosensitive layer is then overexposed through the openings in the masking layer, after which the exposed portions of the photosensitive layer are removed chemically, e.g., by photoresist development. Because of this over-exposure, the removed photoresist provides a structure wherein the openings in the masking layer are smaller than the openings in the underlying photosensitive layer. As a result, an overhang of the metallic masking layer is provided over openings in the photosensitive layer. Because of this overhang, when thin films, particularly metal films, are deposited over the structure, and the remaining photoresist is removed by standard lift-off techniques, the "edge-tearing" problem is minimized.

Where lateral widths of the thin film lines, e.g., metallic lines, to be deposited are spaced in the order of 0.5 mils or greater, the method of said copending application provides a satisfactory and workable lift-off technique for depositing thin films, particularly thin metallic films, without any "edge-tearing" problems. However, where the lateral widths of the spacing between such deposited lines, is narrower, in the order of 0.05 to 0.25 mils, some difficulty may be expected to arise in maintaining complete adhesion of the metallic mask to the underlying photoresist as well as in maintaining adhesion of the deposited thin film metallic lines.

BRIEF SUMMARY OF THE INVENTION

Accordingly, it is a primary object of this invention to provide an improved method for depositing thin film patterns with well defined edges.

It is another object of the present invention to provide an improved lift-off method for depositing such thin films utilizing a composite structure with a metal masking layer wherein there are no adhesion problems with the metal masking layer or with the thin films.

It is still another object of the present invention to provide a method for depositing thin films by a lift-off technique where the deposited thin film lines have lateral dimensions and spacing of under 0.25 mils.

We have found that when utilizing a lift-off method wherein the substrate to be deposited upon is masked by a composite of a metallic masking layer over a photosensitive layer, mask adhesion problems tend to occur where the thin film being deposited has linework and spacing in the order of 0.25 mils or less. One causative factor for such problems is that care must be taken in order to preserve the photosensitivity of the bottom layer during subsequent fabrication steps. Accordingly, when a masking layer, e.g., a metallic masking layer, is deposited over this bottom photosensitive layer, any substantial heating or baking during deposition must be avoided in order to prevent cross-linking in the photosensitive layer which would destroy its photosensitivity. Because of this limitation in heating, there is an attendant limitation on the extent of bonding between the photosensitive layer and the overlying metallic layer. Where the linework and spacing of the subsequently deposited thin film is in the order of 0.5 mils or greater, the bonding is sufficient to retain the masking layer completely intact. However, with the finer linework and spacing, in the order of 0.25 mils or less, the bonding of the masking layer, particularly a metallic masking layer, becomes more questionable.

In addition, even where substantial heating is not utilized in the deposition of the masking layer, it may be desirable to use heat or baking in the deposition of the thin film, particularly a metallic thin film. With a photosensitive bottom layer which is not thermally stable, such subsequent heating must be avoided.

The lift-off method of the present invention solves this problem by first forming a bottom layer of non-sensitive organic polymeric material. Then, a masking layer, which is preferably metallic, is deposited on the bottom layer. In the deposition of this masking layer, as much heat or baking as is necessary to affect complete bonding may be used since the bottom layer is non-photosensitive and will not adversely be affected by such heating.

Next, openings are formed in the masking layer in a preselected pattern, after which corresponding openings are etched through the bottom non-photosensitive polymeric layer by sputter etching. We have found that in such a sputter etching step, it is possible to sustain the sputter etching so that the masking layer, which is formed of an inorganic material such as metal, is undercut to provide the ledge required to avoid pairing during the subsequent lift-off. The sputter etching step is preferably carried out by reactive sputter etching.

Finally, utilizing this composite structure as a mask, a thin film is deposited, after which the composite mask together with the covering thin film is removed, without any edge-tearing. Again, during the deposition of this layer, heating or baking may now be used.

Another advantage of the present invention over processes which use photosensitive resists as bottom layers is that in chemically etching the openings in such resist layers, thick metal masks in the order of 10,000A must be used in order to prevent the etchant from penetrating the masks; such thick masks limit the lateral spacing and lines to lateral dimensions of 0.5 mils or greater. With the present approach, the metal masks need only be in the order of 1,000A to 3,000A thick to be effective sputter etching masks. As a result, lateral dimensions and spacing of 0.25 mils or less become possible.

The foregoing and other objects, features and advantages of the invention will be apparent from the following more particular description and preferred embodiments of the invention as illustrated in the accompanying drawings.

DETAILED DESCRIPTION OF THE PREFERRED EMBODIMENTS

Figures 1A, 1B, 1C, 1D, 1E, 1F, 1G, 1H:
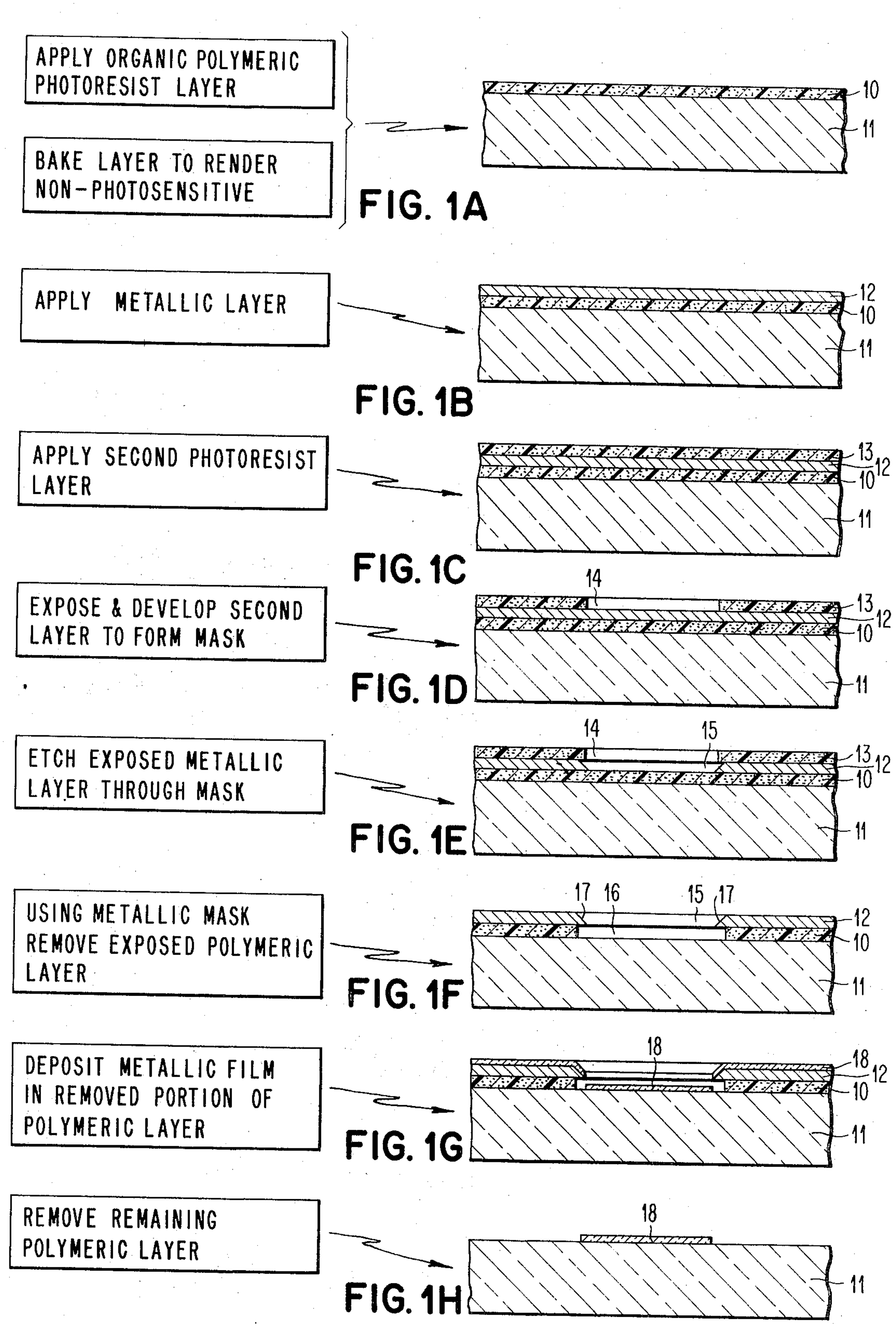
FIGS. 1A—1H are diagrammatic cross-sectional views of a structure being fabricated in accordance with the preferred embodiments of the present invention, as well as a flow chart describing each of the steps.

FIGS. 1A—1H show the formation of the composite mask in accordance with the method of the present invention as well as the utilization of this composite mask for lift-off purposes. With reference to FIG. 1A, an organic polymeric layer 10, which is non-photosensitive, is formed on substrate 11. In the fabrication of integrated circuits, substrate 11 may be a semiconductor material or a semiconductor substrate having a surface layer of an electrically insulative inorganic material, such as silicon dioxide. Layer 10 may be any polymeric material used in coating which is non-photosensitive and displays good adhesion to the substrate 11 as well as to the subsequently to be applied organic masking layer. Because photoresist compositions have an established and known ability to form layers with good adhesion to both substrate and over-layers in the integrated circuit fabrication art, layer 10 may be any standard photoresist material which has been rendered non-photosensitive, e.g., by baking at elevated temperatures. For example, in forming layer 10, a photoresist composition comprising 2:1 KTFR: zylene by volume may be applied to the substrate by conventional spinning techniques. KTFR is distributed by Kodak Corporation and is a cyclized rubber composition containing a photosensitive cross-linking agent. Instead of KTFR, any other conventional photoresist, such as AZ111 (one part AZ111 to two parts thinner), may be applied by spinning. AZ111 is distributed by Shipley Corporation and comprises a novolak-type phenol-formaldehyde resin and a photosensitive cross-linking agent. Next, the applied photoresist is baked at an elevated temperature in the order of 210°C. for a period sufficient to render it thermally stable. This also renders the layer non-photosensitive. This is about 30 minutes for KTFR and 15 minutes for AZ111 compositions. A composite layer of KTFR and AZ111 may be conveniently used to provide layer 10.

Other photoresist materials which may be baked to render them thermally stable and, thus non-photosensitive and used in the manner described above to provide layer 10 are negative photoresist materials including synthetic resins such as polyvinyl cinnamate, polymethyl methacrylate. A description of such synthetic resins and the light sensitizers conventionally used in combination with them may be found in the text "Light Sensitive Systems," by Jaromir Kosar, particularly at Chapter 4. Some photoresist compositions of this type are described in U.S. Pat. Nos. 2,610,120; 3,143,423; and 3,169,868. In addition to (negative) photoresist, there may also be used (positive) photoresist in which a coating normally insoluble in the developer is rendered soluble in the areas exposed to light. Such photoresists, such as those described in U.S. Pat. Nos. 3,046,120 and 3,201,239, include the diazo type photoresists which change to azo compounds in the areas exposed to light, which are thereby rendered soluble in the developer solution.

In addition to the conventional photoresist material, the following polymers may be used for layer 10. Since these materials are already thermally stable and non-photosensitive, no baking step is required to render them non-photosensitve: polyimides such as the reaction product of pyromellitic dianhydride and oxy-p, p'-phenylene diamine or the reaction produce methylene-p, p-'-phenylene and trimellitic and trimellitic acid. It will be understood by those skilled in the art that the adhesion of these polymer materials to substrate 11 or to layer 12 may be enhanced by conventional adhesion promoter or adhesion prompting techniques. The above list of polymeric materials was selected based upon their desirable property of forming only gaseous by-products when sputter etched at the chamber pressures described above.

Other polymeric materials which produce solid by-products when sputter etched may be used provided that such by-products are soluble in aqueous alkaline solutions which may then be used after etching to remove such by-products.

The dry thickness of layer 10 is in the order of 2 microns.

Next, as set forth in FIG. 1B, a layer of inorganic material 12, preferably metal, is deposited on layer 10 at elevated temperatures. For example, a layer of copper 1000A in thickness may be deposited by conventional evaporation techniques at a temperature of from room temperature to 150°C. Other metals which may be used for the masking layer 12 are aluminum and chromium. In addition, inorganic material, such as glass, silicon nitride or aluminum oxide may be used.

Then, as set forth in FIGS. 1C and 1D, the predetermined pattern of openings is formed in masking layer 12 by conventional photolithographic techniques used in the integrated circuit fabrication art. A layer of any standard photoresist material 13 is formed on layer 12. Layer 13 is then exposed and developed in the conventional manner to form a photoresist mask having openings 14 as shown in FIG. 1D.

Then, using a conventional etchant for the metallic material in layer 12, those portions of layer 12 exposed in openings 14 are etched away to form openings 15 in masking layer 12. For example, for a copper material layer 12, a conventional iodine, potassium iodide etch may be used, e.g., an etch comprising 18 grams iodine and 18 grams potassium iodide in 1,500 ccs. of water, FIG. 1E.

Next, FIG. 1F, using layer 12 as a mask, the structure is subjected to sputter etching which is conducted in the conventional manner at reduced atmospheric pressure in glow discharge apparatus. A typical apparatus and method for achieving such sputter etching is described in U.S. Pat. No. 3,598,710. Where mask 12 is metal, standard DC sputter etching may be used instead of the RF sputter etching described in said patent. The sputter etching may be conducted using an inert gas, such as argon or neon, for the requisite ion bombardment. In addition, the sputter etching may be carried out utilizing reactive gases such as oxygen or hydrogen. U.S. Pat. No. 3,471,396 sets forth a listing of inert or reactive gases or combinations thereof which may be used in sputter etching.

An effective RF sputter etching system for the non-photosensitive layers derived from the above-described specific photoresist is an RF sputter etching system described in the above-mentioned patent utilizing an oxygen atmosphere at a temperature in the order of 150°C. and a pressure of 40 millitorrs at a power density of $0.12 w/cm^2$. The etching is conducted for a period of time sufficient to form openings 16 in polymeric layer 10, which are laterally wider than openings 15 and, thus, undercut metallic layer 12, leaving overhangs 17. Next, using the lift-off composite of FIG. 1F, a metallic film 18 is deposited over the structure, FIG. 1G. This metallic film may be any metal conventionally used for integrated circuit metallization, e.g., aluminum, aluminum-copper, alloys, platinum, palladium, chromium, silver, tantalum, gold and titanium or combinations thereof. The metal films is deposited at a temperature of from room temperature to about 150°C. Alternatively, layer 18 may be an inorganic electrically insulative material, such as silicon dioxide or silicon nitride. These insulative materials may be deposited in any conventional sputter deposition system.

Film 18 has a thickness in the order of 15,000A to 25,000A microns.

Next, utilizing conventional lift-off removal techniques, photoresist layer 10 is completely removed by immersion into a solvent, such as N-methyl pyrrolidone standard photoresist solvent, for about 15 to 30 minutes, which leaves thin film layer 18 in the desired or preselected configuration, FIG. 1H. The solvent selected should be one which dissolves or swells polymeric material of layer 10 without affecting the thin film. Such solvents include acetone, isopropanol, ethyl methyl ketone or trichloroethylene. The solvents used to dissolve the polymeric material may be the same solvents used to apply the polymer as coating 10.

Where the photoresist compositions which have been rendered non-photosensitive are used as the polymeric material, conventional photoresist strippers may be used. For example, for KTFR, the stripper may be a composition comprising

| | By Weight |
|---|---|
| Tetrachloroethylene | 44.5 |
| O-Dichlorobenzene | 37.0 |
| P-Dichlorobenzene | 0.8 |
| Phenol | 17.6 |

For the AZ-type photoresist compositions, N-methyl pyrrollidone strippers may be used.

It should be noted that the term thin film as used in the present specification and claims is not meant to define any particular film thickness but rather to designate the thin film technology.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of depositing patterned thin films on an inorganic substrate comprising:

forming on said substrate a first layer of non-photosensitive organic polymeric material which is adherent to said substrate, forming, on said first layer, a masking layer of an inorganic material, adherent to said first layer, having openings in a selected pattern, forming, by sputter etching, openings through said first layer extending to said substrate, said first layer openings being aligned with and laterally wider than said masking layer openings, and depositing said thin films onto said substrate through said aligned openings using said masking layer as a deposition mask.

2. The method of claim 1 wherein said sputter etching is reactive sputter etching.

3. The method of claim 2 wherein said masking layer is metallic.

4. The method of claim 3 wherein said substrate is a semiconductor substrate.

5. The method of claim 3 wherein said substrate is a metallic oxide.

6. The method of claim 5 wherein said substrate is silicon dioxide.

7. The method of claim 3 wherein said reactive sputter etching step is conducted utilizing oxygen as the reactive gas.

8. The method of claim 6 wherein said reactive sputter etching step is conducted utilizing oxygen as the reactive gas.

9. The method of claim 3 wherein the masking layer is formed by the steps of:

applying a metallic layer on said first layer, and forming the selected pattern of opening.

10. The method of claim 9 wherein said openings in said metallic layer are formed by the steps of:

forming a photoresist mask having openings corresponding to said selected pattern over said metallic layer, and selectively removing exposed portions of said metallic layer.

11. The method of claim 9 wherein said metallic layer is applied at a temperature above 100°C.

12. The method of claim 11 wherein said substrate is silicon dioxide.

13. The method of claim 2, including the further step of remocing the first layer and the masking layer after the deposition of said thin films on said substrate.

14. The method of claim 11, including the further step of removing the first layer and the masking layer after the deposition of said thin films on said substrate.

15. The method of claim 2 wherein said first layer is formed by the steps of:

applying a polymeric photoresist layer to said substrate, and heating to render said photoresist layer non-photosensitive.

16. The method of claim 6 wherein said first layer is formed by the steps of:

applying a polymeric photoresist layer to said substrate, and heating to render said photoresist layer non-photosensitive.

* * * * *